(12) United States Patent
Oestreich et al.

(10) Patent No.: US 6,365,643 B1
(45) Date of Patent: Apr. 2, 2002

(54) PHOTOINITIATORS FOR CATIONIC CURING

(75) Inventors: Sascha Oestreich; Wolfgang Müller, both of Essen (DE)

(73) Assignee: Th. Goldschmidt AG, Essen (DE)

( * ) Notice: Subject to any disclaimer, the term of this patent is extended or adjusted under 35 U.S.C. 154(b) by 0 days.

(21) Appl. No.: 09/482,255

(22) Filed: Jan. 13, 2000

(30) Foreign Application Priority Data

Jan. 16, 1999 (DE) .......................................... 199 01 531

(51) Int. Cl.$^7$ .............................. C08F 2/50; C07F 7/02; C07F 7/04; C07F 7/06; C07F 7/08

(52) U.S. Cl. .......................... 522/31; 522/25; 522/170; 522/181; 522/185; 522/99; 522/148; 528/12; 528/13; 528/19; 528/23; 528/33; 528/40; 528/32; 556/400; 556/402; 556/463; 556/482; 556/486; 556/9

(58) Field of Search .............................. 522/25, 31, 99, 522/148, 170, 181, 185; 556/463, 482, 400, 402, 412, 450, 9, 486; 528/12, 13, 19, 23, 33, 40, 32

(56) References Cited

U.S. PATENT DOCUMENTS

| | | | |
|---|---|---|---|
| 4,279,717 A | | 7/1981 | Eckberg et al. |
| 4,310,469 A | | 1/1982 | Crivello |
| 4,374,066 A | | 2/1983 | Crivello et al. |
| 5,073,643 A | | 12/1991 | Crivello |
| 5,086,192 A | * | 2/1992 | Kessel et al. |
| 5,468,890 A | * | 11/1995 | Herzig et al. |
| 5,719,248 A | * | 2/1998 | Herzig et al. |
| 5,866,666 A | * | 2/1999 | Herzig et al. |

FOREIGN PATENT DOCUMENTS

| | | | |
|---|---|---|---|
| DE | 2518639 | | 11/1975 |
| EP | 0 334 056 B1 | | 9/1989 |
| EP | 0 618 919 B1 | | 10/1994 |
| WO | 93-22369 A | * | 11/1993 |

OTHER PUBLICATIONS

Kunze et al., "Triplet quenching by onium salts in polar and nonpolar solvents", Journal of Photochemistry and Photobiology A: Chemistry 110 pp. 115–122, 1997.

* cited by examiner

*Primary Examiner*—Susan W. Berman
(74) *Attorney, Agent, or Firm*—Frommer Lawrence & Haug LLP

(57) ABSTRACT

The invention relates to modified cationic photoinitiators which exhibit a reduced tendency to crystallize, to a process for reducing the crystallization tendency of cationic photoinitiators, and to the use of the photoinitiators of the invention for the radiation curing of cationically curing compositions. The inventive cationic photoinitiators have the formula (IV):

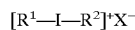

where $R^1$ is a radical

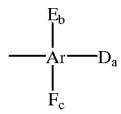

$R^2$ is a radical

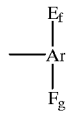

in which Ar is a monovalent aromatic hydrocarbon radical and D being a radical

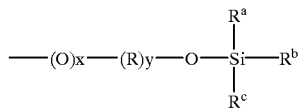

and the remaining variables are defined herein.

19 Claims, No Drawings

PHOTOINITIATORS FOR CATIONIC CURING

BACKGROUND OF THE INVENTION

1. Field of the Invention

The invention relates to modified cationic photoinitiators possessing a reduced crystallization tendency, to a process for reducing the crystallization tendency of cationic photoinitiators, and to the use of the photoinitiators of the invention for the radiation curing of cationically curing compositions.

2. Description of the Related Art

Cationic photopolymerization is a rapid, efficient and environment-friendly means of curing cationically polymerizable monomers. Particularly efficient photoinitiators are diaryliodonium salts (I) and triarylsulfonium salts (II).

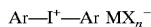  (I)

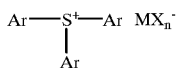  (II)

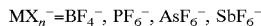

Diaryliodonium salts (I) in particular are known from the patent literature (DE-A-25 186 39, U.S. Pat. No. 4,279,717, EP-A-0 334 056, and EP-B-0 618 919) as well as their use as photoinitiators for polymerizing cationically polymerizable substances. The cationically polymerizable substances have, however, little or no polarity, especially if the polymerizable groups are present in organopolysiloxanes. When adding these photoinitiators, therefore, it is a very common observation that, depending on the structure of the formulation, the miscibility and solubility of the photoinitiators is limited. For this reason, the aryl radicals of such onium salts are often substituted with alkyl chains in order to increase the solubility in organopolysiloxanes (U.S. Pat. No. 4,310,469 and U.S. Pat. No. 4,374,066).

Diaryliodonium salts as described in U.S. Pat. No. 5,073,643 are likewise hydrophobically modified by alkyl chains. In addition, however, they carry a hydroxyl group. This results in deficient miscibility with organopolysiloxanes. After just a short time, turbidity and the precipitation of the photoinitiator are observed. Because of their inhomogeneity, such coatings do not cure very well under UV irradiation. It is also possible, however, for massive surface defects (craters, wrinkling, specks, etc.) to appear during the application of a thin layer on a substrate, as a result of the inhomogeneity.

In the case of hydroxyl-bearing iodonium salts as described in U.S. Pat. No. 5,073,643, the poor solubility in nonpolar media is attributed to the high crystallization tendency. The particular complexation characteristics of the hydroxyl-bearing iodonium salts of the general formula (III) results in a strong crystallization tendency in the compounds (A. Kunze, U. Müller, K. Tittes, J. P. Fonassier, F. Morlet-Savary, J. Photochemistry and Photobiology A: Chemistry, 110, 115–122 (1997)):

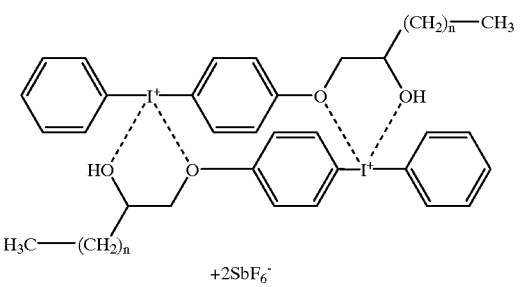  (III)

The two oxygen atoms in the molecule act as ligands for a second iodonium ion. This aggregation behavior promotes the formation of crystals.

In the preparation of these iodonium salts, the strong crystallization tendency is entirely desirable, since it means that the compounds can be recovered as powders in a high purity by simple recrystallization. In this way, they are easy and cost effective to prepare. Such iodonium salts are commercially available under the trade name CD-1012 from Sartomer.

The high crystallization tendency has an adverse effect, however, when these iodonium salts are to be dissolved in nonpolar media, such as organopolysiloxanes. In this case either they are insoluble or a solid precipitate forms after just a short time.

OBJECT OF THE INVENTION

An object of the invention is to modify hydroxyl-bearing iodonium salts in a particularly cost effective and simple manner such that the crystallization tendency is greatly reduced and good compatibility with organopolysiloxanes containing epoxy groups is established.

SUMMARY OF THE INVENTION

The above object is achieved in a first embodiment by means of cationic photoinitiators of the general formula IV

  (IV)

where I is the element iodine, $X^-$ is the anion of a complex metal salt or of a strong acid, $R^1$ is a radical

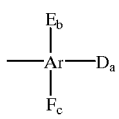

in which Ar is a monovalent aromatic hydrocarbon radical, preferably having 6 to 14 carbon atoms per radical, or is a monovalent aromatic hydrocarbon radical containing at least one oxygen and/or sulfur atom and, preferably, having 5 to 15 ring atoms per radical, a is 1, 2 or 3, b is 0, 1 or 2, c is 0, 1 or 2, D, E and F are each substituents of Ar, D being a radical of the formula

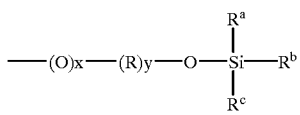

where
x is 0 or 1,
y is 0 or 1,
R is a linear or branched divalent hydrocarbon radical, preferably having 1 to 40 carbon atoms per radical, which can be interrupted, if desired, by at least one oxygen atom and/or one sulfur atom and/or one carboxyl group,
$R^a$, $R^b$ and $R^c$ each independently are selected from the group consisting of monovalent alkyl, aryl, haloalkyl and alkoxy radicals having 1 to 40 carbon atoms, preferably having 1 to 14 carbon atoms, and most preferably having 1 to 4 carbon atoms,
E is a radical

F is a radical

$R^2$ is a radical

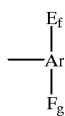

where
$R^d$ is a monovalent hydrocarbon radical, preferably having 1 to 18 carbon atoms per radical, which can be interrupted, if desired, by at least one oxygen atom,
$R^e$ is a monovalent hydrocarbon radical, preferably having 1 to 18 carbon atoms per radical, which can be interrupted, if desired, by at least one oxygen atom,
f is 0, 1 or 2, and
g is 0, 1 or 2.

Surprisingly, it has been found that the modification of hydroxyl-containing cationic photoinitiators makes it possible to reduce considerably the crystallization tendency and to improve substantially the compatibility with organopolysiloxanes containing epoxy groups.

DESCRIPTION OF THE PREFERRED EMBODIMENTS

Preferred examples of aromatic hydrocarbon radicals Ar are the phenyl, naphthyl and anthryl radicals.

Preferred examples of aromatic hydrocarbon radicals Ar containing at least one oxygen and/or sulfur atom are the 2-furyl, 3-furyl, 2-thienyl and 3-thienyl radicals.

Preferred examples of the divalent hydrocarbon radicals R which can be interrupted by at least one oxygen atom and/or one sulfur atom and/or one carboxyl group are —CH$_2$—, —CH$_2$—CH$_2$—, and —CH$_2$—CH$_2$—O—CH$_2$—CH$_2$—.

Preferred examples of hydrocarbon radicals $R^a$, $R^b$, $R^c$ are alkyl radicals, such as the methyl, ethyl, n-propyl, isopropyl, n-butyl, isobutyl, tert-butyl, n-pentyl, isopentyl, neopentyl, and tert-pentyl radical; hexyl radicals, such as the n-hexyl radical; heptyl radicals, such as the n-heptyl radical; octyl radicals, such as the n-octyl radical and isooctyl radicals, such as the 2,2,4-trimethylpentyl radical; nonyl radicals, such as the n-nonyl radical; decyl radicals, such as the n-decyl radical; dodecyl radicals, such as the n-dodecyl radical, and octadecyl radicals, such as the n-octadecyl radical; and aryl radicals such as the phenyl, naphthyl and anthryl radicals.

Preferably, all three radicals $R^a$, $R^b$, $R^c$ attached to the silicon atom together contain 3 to 25 carbon atoms.

The examples given above of the radicals $R^a$, $R^b$ and $R^c$ also apply totally to the radicals $R^d$ and $R^e$.

Preferred examples of hydrocarbon radicals $R^d$ and $R^e$ interrupted by at least one oxygen atom and/or one sulfur atom are —CH$_2$—CH$_2$—O—CH$_3$, —CH$_2$—CH$_2$O—CH$_2$CH$_3$, and —CH$_2$—CH$_2$—S—CH$_3$.

Preferred examples of radicals D are

—O(CH$_2$)$_2$—O—Si(CH$_3$)$_3$
—O(CH$_2$)$_2$—O—Si(CH$_2$CH$_3$)$_3$
—O(CH$_2$)$_2$—O—SiMe$_2$Oct
—O—(CH$_2$)$_2$—O—SiMe$_2$Ph
—O—(CH$_2$)$_2$—O—SiMePh$_2$

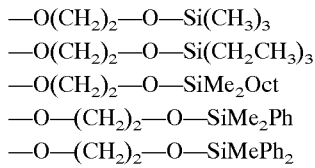

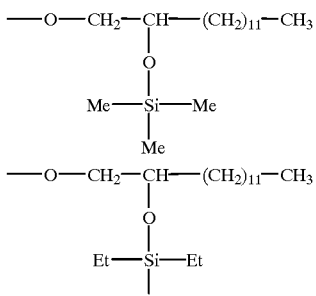

(in which Me is methyl radical, Et is ethyl radical, Ph is phenyl radical, and Oct is n-octyl radical).

Preferred examples of radicals E are the methoxy, ethoxy and n-butoxy radicals.

Preferred examples of radicals F are the methyl, ethyl, propyl, 2-methylpropyl and n-butyl radicals.

Preferred examples of radicals $R^1$ are

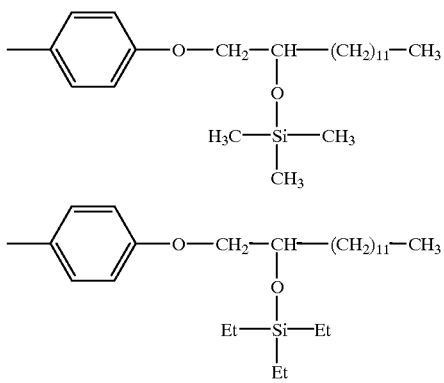

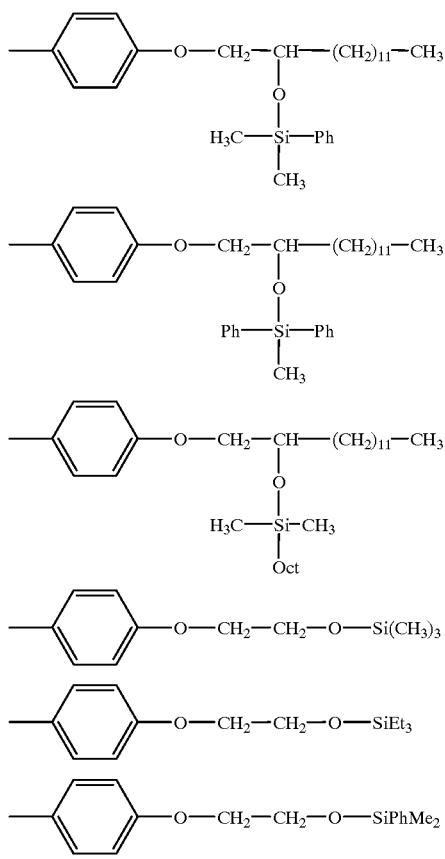

(in which Me, Et, Ph and Oct are each as defined above).

Preferred examples of radicals $R^2$ are the phenyl, 4-methylphenyl, 3-methoxyphenyl and 4-methoxyphenyl radical.

Preferred examples of anions $X^-$ of a complex metal salt or of a strong acid are tosylate, $SbF_6^-$, $PF_6^-$, $BF_4^-$, $F_3CSO_3^-$, $F_3CCO_2^-$, $AsF_6^-$, $ClO_4^-$, $HSO_4^-$. For the purposes of the present strong acids embrace, in particular, strong Bronsted acids.

Preferred cationic photoinitiators of reduced crystallization tendency are those of the general formula V

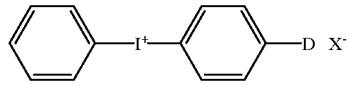

(V)

where D and $X^-$ are as defined above.

Particularly preferred cationic photoinitiators of reduced crystallization tendency are those of the formula VI below

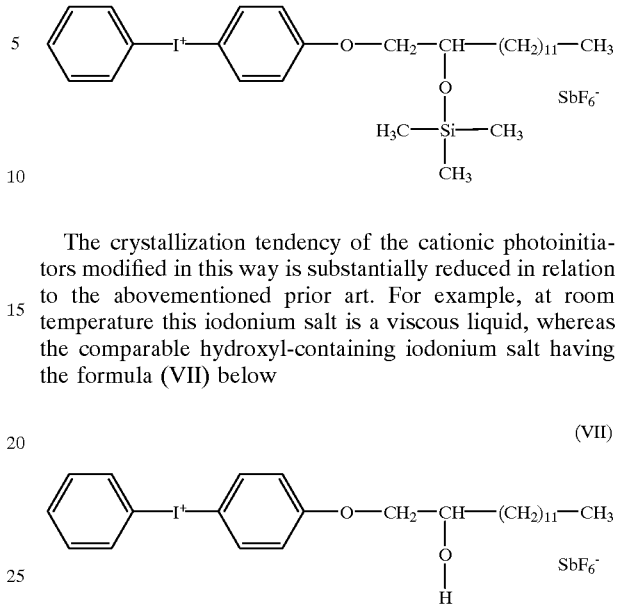

(VI)

The crystallization tendency of the cationic photoinitiators modified in this way is substantially reduced in relation to the abovementioned prior art. For example, at room temperature this iodonium salt is a viscous liquid, whereas the comparable hydroxyl-containing iodonium salt having the formula (VII) below

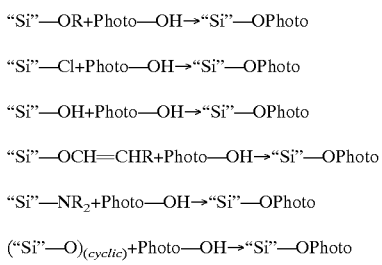

(VII)

is a powder having a melting point of 91° C., which is available under the trade name CD-1012 from Sartomer.

Likewise, the solubility of the cationic photoinitiators of the invention in nonpolar media, such as n-alkanes or siloxanes, is substantially greater than that of the comparable hydroxyl-containing cationic photoinitiators.

For example, the iodonium salt of the general formula (VI) has unrestricted solubility in white spirit. In contrast, the comparable hydroxyl-containing iodonium salt of the general formula (VII) is insoluble in white spirit and shows no miscibility with organopolysiloxanes containing epoxy groups.

The invention additionally provides a process for preparing the cationic photoinitiators having reduced crystallization tendency. Cationic photoinitiators of the invention are readily prepared by a diverse range of routes, as indicated below. A hydroxyl-containing cationic photoinitiator can be reacted, for example, with a chlorosilane, a chlorosiloxane, a silanol, a silyl vinyl ether, a silazane, or a cyclic siloxane.

"Si"—OR+Photo—OH→"Si"—OPhoto

"Si"—Cl+Photo—OH→"Si"—OPhoto

"Si"—OH+Photo—OH→"Si"—OPhoto

"Si"—OCH=CHR+Photo—OH→"Si"—OPhoto

"Si"—NR$_2$+Photo—OH→"Si"—OPhoto ("Si"—O)$_{(cyclic)}$+Photo—OH→"Si"—OPhoto where "Si" denotes a general silane radical and "Photo" denotes an unmodified photoinitiator radical.

The process of the invention comprises reacting a hydroxyl-containing photoinitiator having the general formula (IV')

(IV')

in which I is the element iodine, $X^-$ is the anion of a complex metal salt or of a strong acid, $R^1$ is a radical

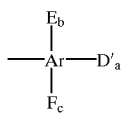

in which Ar is a monovalent aromatic hydrocarbon radical, preferably having 6 to 14 carbon atoms per radical, or is a monovalent aromatic hydrocarbon radical containing at least one oxygen and/or sulfur atom and, preferably, having 5 to 15 ring atoms per radical,
a is 1, 2 or 3,
b is 0, 1 or 2,
c is 0, 1 or 2,
D', E and F are each substituents of Ar,
D' being a radical of the formula

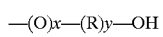

where
x is 0 or 1,
y is 0 or 1,
R is a linear or branched divalent hydrocarbon radical, preferably having 1 to 40 carbon atoms per radical, which can be interrupted, if desired, by at least one oxygen atom and/or one sulfur atom and/or one carboxyl group,
E is a radical

F is a radical

$R^2$ is a radical

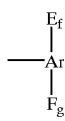

where
C, E and F are as defined above,
$R^d$ is a monovalent hydrocarbon radical, preferably having 1 to 18 carbon atoms per radical, which can be interrupted, if desired, by at least one oxygen atom,
$R^e$ is a monovalent hydrocarbon radical, preferably having 1 to 18 carbon atoms per radical, which can be interrupted, if desired, by at least one oxygen atom,
f is 0, 1 or 2, and
g is 0, 1 or 2,
with a chlorosilane, a silanol, a silylamine, a silyl vinyl ether, a silazane and/or a cyclic siloxane.

Preferred hydroxyl-containing cationic photoinitiators are those of the general formula (V')

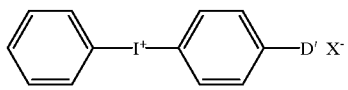

where D' and X⁻ are as defined above.

Particularly preferred starting materials are iodonium salts of the formula (VI') below

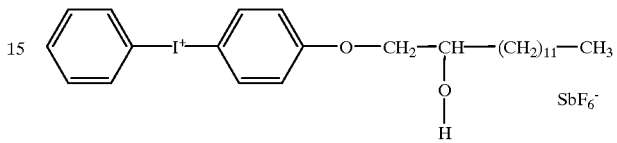

Examples of chlorosilanes which can be reacted with hydroxyl-bearing cationic photoinitiators are those having the general formula (VIII)

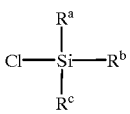

where $R^a$, $R^b$, $R^c$ are each selected independently and are as defined above.

Particularly preferred chlorosilanes which can be reacted with hydroxyl-bearing cationic photoinitiators are chlorotrimethylsilane, (chloromethyl)dimethylchlorosilane, (bromomethyl)dimethylchlorosilane, dimethylethylchlorosilane, triethylchlorosilane, dimethylpropylchlorosilane, tripropylchlorosilane, isopropyldimethylchlorosilane, triisopropylchlorosilane, 3-(chloropropyl)dimethylchloro-silane, dimethyl-(3,3,3-trifluoropropyl)chlorosilane, tert-butyldimethylchlorosilane, tert-butyldiphenylchlorosilane, butyldimethylchlorosilane, tributylchlorosilane, triiso-butylchlorosilane, dimethyl-(3,3,4,4,5,5,6,6,6-nonafluoro-hexyl)chlorosilane, hexyldimethylchlorosilane, dimethyloctylchlorosilane, diisopropyloctylchlorosilane, decyl-dimethylchlorosilane, dimethyldodecylchlorosilane, dimethyl-octadecylchlorosilane, dimethylphenylchlorosilane, diphenylmethylchlorosilane, triphenylchlorosilane, (pentafluorophenyl)-dimethylchlorosilane, tribenzylchlorosilane, dimethyl(2-phenylethyl)chlorosilane, dimethylvinylchlorosilane and allyldimethylchlorosilane.

Examples of silazanes which can be reacted with hydroxyl-bearing cationic photoinitiators are those having the general formula (IX)

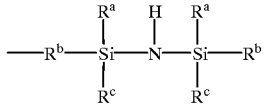

where $R^a$, $R^b$, and $R^c$ are each selected independently and are as defined above.

Particularly preferred silazanes which can be reacted with hydroxyl-bearing cationic photoinitiators are hexamethyldisilazane, 1,3-bis(chloromethyl)-1,1,3,3-tetramethyl-disilazane, hexaethyldisilazane, 1,3-dipropyl1,1,3,3-tetramethyldisilazane, 1,3-dioctyl-1,1,3,3-tetramethyldisilazane, 1,3-diphenyl-1,1,3,3-tetramethyldi-silazane, 1,3-dimethyl-1,1,3,3-tetraphenyldisilazane, and 1,3-divinyl-1,1,3,3-tetramethyldisilazane.

Examples of silylamines are those having the general formula (X)

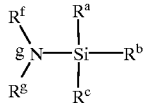
(X)

where $R^a$, $R^b$, $R^c$, $R^f$ and $R^g$ are each selected independently and $R^f$ and $R^g$ are as defined above for $R^a$.

Particularly preferred silylamines which can be reacted with hydroxyl-bearing cationic photoinitiators are N,N-dimethyltrimethylsilylamine, N,N-bis(trimethylsilyl)methyl-amine, N,N-diethyltrimethylsilylamine, N-benzyltrimethyl-silylamine, 1-(trimethylsilyl)imidazole, 4-(trimethyl-silyl)morpholine, 1-(trimethylsilyl)pyrrolidine, N-(tert-butyldimethylsilyl)dimethylamine, N-tert-butyltrimethyl-silylamine, 1-(tert-butyldimethylsilyl)imidazole, N-(hexyl-dimethylsilyl)dimethylamine, N-(octyldiisopropyl-silyl)-dimethylamine, N-(octadecyldiisobutylsilyl)dimethyl-amine, N-(octadecyldiisopropylsilyl)dimethylamine, and triphenyl-silylamine.

The iodonium salts are sensitive to light and on exposure to ultraviolet light, for example, break down in accordance with a multistage mechanism which is described in the book "UV Curing: Science & Technology" by P. Pappas on p. 34. The active end product of this photolysis is regarded as being the resulting Brönsted acid—for example, $HPF_6$, $HAsF_6$—which in turn initiates the polymerization of cationically polymerizable substances, such as epoxides or vinyl ethers.

The iodonium salts of the invention are suitable as photoinitiators for the polymerization of cationically polymerizable organic substances, such as epoxides, vinyl ethers, organopolysiloxanes containing epoxy groups, organopolysiloxanes containing alkenyloxy groups, such as vinyloxy or propenyloxy groups, and olefins. Such substances are the content, for example, of U.S. Pat. No. 5,057,549, DE-A-40 02 922, and the patent documents cited at the outset.

WORKING EXAMPLES

Example 1

10 g of commercial photoinitiator of the formula (VII) were dissolved in 20 g of tetrahydofuran (THF), and 2.78 g of octyldimethylchlorosilane and a few drops of N-methylimidazole were added to the clear solution. The mixture was heated to 60° C. in a water bath and stirred for 4 h while passing in nitrogen. During this time, the THF solvent was replaced continually. Following the reaction, the solvent was removed by distillation, leaving a waxlike product.

Example 2

10 g of commercial photoinitiator of formula (VII) were dissolved in 20 g of THF, and 10.81 g of hexamethyldisilazane were added to the clear solution. The mixture was stirred for 1 h, and then excess hexamethyldisilazane and solvent were removed under reduced pressure to leave a yellow, viscous product.

Example 3

10 g of commercial photoinitiator of formula (VII) were dissolved in 20 g of THF, and 11 g of diphenyltetramethyldisilazane were added to the clear solution. The mixture was stirred for 1 h, and then excess diphenyltetramethyldisilazane and solvent were removed under reduced pressure to leave an amber-colored, viscous product.

Example 4

42 g of commercial photoinitiator of formula (VII) were dissolved in 80 g of THF, and 24.4 g of N,N-diethyltrimethylsilylamine were added to the clear solution. The mixture was stirred for 1 h, and then excess N,N-diethyltrimethylsilylamine and solvent were removed by distillation under reduced pressure to leave a reddish brown, viscous product.

Comparison 1

The solubility of the cationic photoinitiators of the invention was compared with the solubility of commercial, hydroxyl-bearing cationic photoinitiators. The results are summarized in Table 1:

TABLE 1

| Photoinitiator | Solubility in white spirit |
|---|---|
| CD-1012 | insoluble |
| Ex. 1 | soluble to an opaque solution |
| Ex. 2 | soluble to a clear solution |
| Ex. 3 | soluble to a clear solution |
| Ex. 4 | soluble to a clear solution |

The solubility difference between the hydroxyl-containing photoinitiator CD-1012 and the hydrophobically modified cationic photoinitiators of the invention is considerable.

Comparison 2

The reduction in the crystallization tendency can be illustrated with particular clarity on the basis of the melting point of the compounds.

TABLE 2

| Photoinitiator | Melting point |
|---|---|
| CD-1012 | 91° C. |
| Ex. 1 | viscous oil |
| Ex. 2 | viscous oil |
| Ex. 3 | viscous oil |
| Ex. 4 | viscous oil |

It was found that the modification achieved a considerable reduction in the melting point and therefore in the crystallization tendency.

The above description of the inventive is intended to be illustrative and not limiting. Various changes and modifications in the embodiments described above may occur to those skilled in the art. These changes can be made without departing from the scope of the invention.

What is claimed is:

1. A cationic photoinitiator of the formula IV $$[R^1\text{—}I\text{—}R^2]^+X^-  \qquad (IV)$$

where I is the element iodine,

X⁻ is the anion of a complex metal salt or of a strong acid,

R¹ is a radical

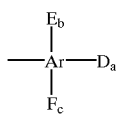

in which Ar is a monovalent aromatic hydrocarbon radical or is a monovalent aromatic hydrocarbon radical containing at least one oxygen and/or sulfur atom, a is 1, 2 or 3,
b is 0, 1 or 2,
c is 0, 1 or 2,
D, E and F are each substituents of Ar,
D being a radical

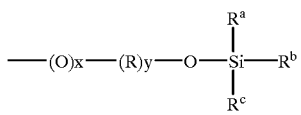

where
x is 0 or 1,
y is 0 or 1,
R is a linear or branched divalent hydrocarbon radical, which is optionally interrupted by at least one oxygen atom, sulfur atom and/or carboxyl group,
$R^a$, $R^b$ and $R^c$ each independently are selected from the group consisting of monovalent alkyl, aryl, haloalkyl and alkoxy radicals,
E is a radical —O—$R^d$, F is a radical —$R^e$, $R^2$ is a radical

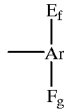

where
$R^d$ is a monovalent hydrocarbon radical, which is optionally interrupted by at least one oxygen atom,
$R^e$ is a monovalent hydrocarbon radical, which is optionally interrupted by at least one oxygen atom,
f is 0, 1 or 2, and
g is 0, 1 or 2.

2. The photoinitiator as claimed in claim 1, wherein Ar is a monovalent aromatic hydrocarbon radical having 6 to 14 carbon atoms per radical or is a monovalent aromatic hydrocarbon radical containing at least one oxygen and/or sulfur atom and having 5 to 15 ring atoms per radical, R is a linear or branched divalent hydrocarbon radical, having from 1 to 40 carbon atoms per radical which is optionally interrupted by at least one oxygen atom, sulfur atom and/or carboxyl group, $R^a$, $R^b$ and $R^c$ each independently are selected from the group consisting of monovalent alkyl, aryl, haloalkyl and alkoxy radicals, having from 1 to 40 carbon atoms, E is a radical —O—$R^d$, F is a radical —$R^e$, $R^2$ is a radical

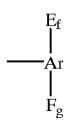

where
$R^d$ is a monovalent hydrocarbon radical having 1 to 18 carbon atoms per radical, which is optionally interrupted by at least one oxygen atom,
$R^e$ is a monovalent hydrocarbon radical having 1 to 18 carbon atoms per radical, which is optionally interrupted by at least one oxygen atom,
f is 0, 1 or 2, and
g is 0, 1 or 2.

3. The photoinitiator as claimed in claim 1, wherein the aromatic hydrocarbon radical Ar is phenyl, naphthyl or anthryl.

4. The photoinitiators as claimed in claim 1, wherein Ar is 2-furyl, 3-furyl, 2-thienyl or 3-thienyl.

5. The photoinitiator as claimed in claim 1, wherein D is a radical

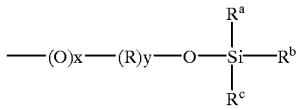

where
x is 0 or 1,
y is 0 or 1,
R is —CH₂—, —CH₂—CH₂—, —CH₂—CH₂—O—CH₂—CH₂— and —CH₂—CH—(CH₂)₁₁—CH₃
$R^a$, $R^b$ and $R^c$ each independently are selected from the group consisting of methyl, ethyl, n-propyl, isopropyl, n-butyl, isobutyl, tert-butyl, n-pentyl, isopentyl, neopentyl, tert-pentyl, n-hexyl, n-heptyl, n-octyl, 2,2,4-trimethylpentyl, n-nonyl, n-decyl, n-dodecyl, n-octadecyl, phenyl, naphthyl and anthryl.

6. The photoiniator as claimed in claim 1, where D is
—O(CH₂)₂—O—Si(CH₃)₃;
—O(CH₂)₂—O—Si(CH₂CH₃)₃;
—O(CH₂)₂—O—SiMe₂Oct;
—O—(CH₂)₂—O—SiMe₂Ph;

—O—(CH$_2$)$_2$—O—SiMePh$_2$;

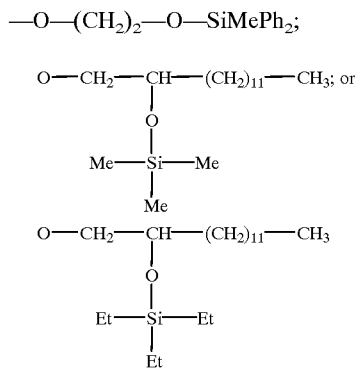

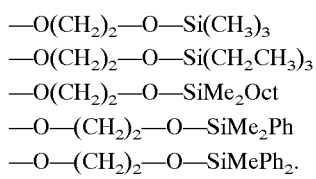

wherein Me is methyl, Et is ethyl, Ph is phenyl, and Oct is n-octyl.

7. The photoinitiator as claimed in claim 6, wherein D is

—O(CH$_2$)$_2$—O—Si(CH$_3$)$_3$
—O(CH$_2$)$_2$—O—Si(CH$_2$CH$_3$)$_3$
—O(CH$_2$)$_2$—O—SiMe$_2$Oct
—O—(CH$_2$)$_2$—O—SiMe$_2$Ph
—O—(CH$_2$)$_2$—O—SiMePh$_2$.

8. The photoiniator as claimed in claim 1, wherein R$^1$ is

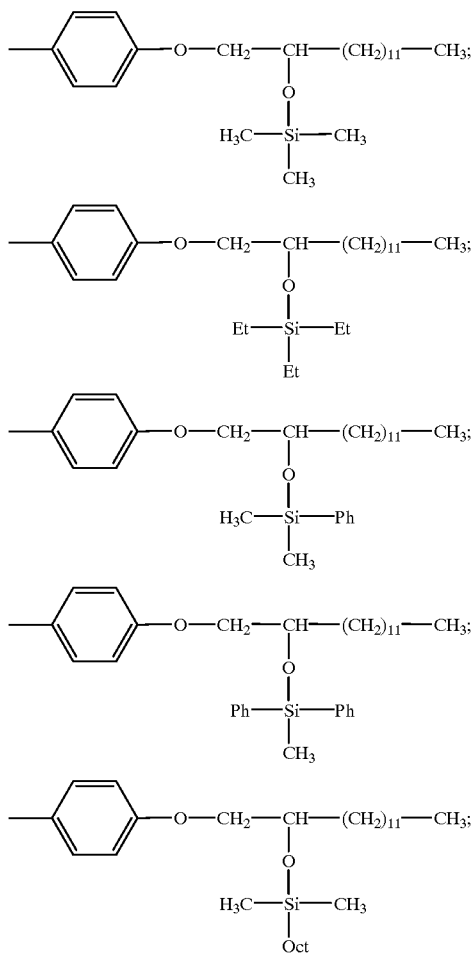

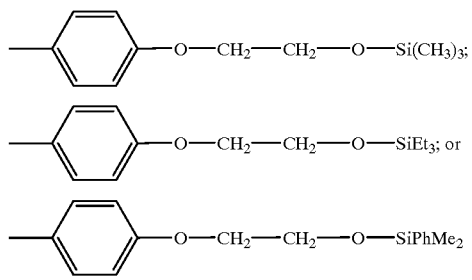

9. The photoinitiator as claimed in claim 1, wherein the radicals R$^2$ are selected from the group consisting of phenyl, 4-methylphenyl, 3-methoxyphenyl and 4-methoxyphenyl.

10. The photoinitiator as claimed in claim 1, wherein the anion X$^-$ of a complex metal salt or of a strong acid is selected from the group consisting of tosylate, SbF$_6^-$, PF$_6^-$, BF$_4^-$, F$_3$CSO$_3^-$, F$_3$CCO$_2^-$, AsF$_6^-$, ClO$_4^-$, and HSO$_4^-$.

11. The photoiniators as claimed in claim 1, wherein the photoiniator is

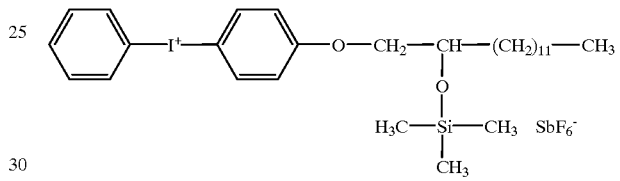

12. A process for preparing a photoinitiator of the formula IV as set forth in claim 1, which comprises reacting a hydroxyl-containing photoinitiator having the formula (IV')

[R$^1$—I—R$^2$]$^+$X$^-$     (IV')

in which I is the element iodine,
X$^-$ is the anion of a complex metal salt or of a strong acid,
R$^1$ is a radical

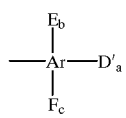

in which Ar is a monovalent aromatic hydrocarbon radical or is a monovalent aromatic hydrocarbon radical containing at least one oxygen and/or sulfur atom
a is 1,2 or 3,
b is 0, 1 or 2,
c is 0, 1 or 2,
D', E and F are each substituents of Ar,
D' being a radical —(O)x—(R)y—OH where
x is 0 or 1,
y is 0 or 1,
R is a linear or branched divalent hydrocarbon radical, which is optionally interrupted by at least one oxygen atom, sulfur atom, and/or carboxyl group,
E is a radical —O—R$^d$, F is a radical —$R^e$, $R^2$ is a radical

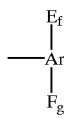

where

Ar, E and F are as defined above, $R^d$ is a monovalent hydrocarbon radical, which is optionally interrupted by at least one oxygen atom, $R^e$ is a monovalent hydrocarbon radical, which is optionally interrupted by at least one oxygen atom, f is 0, 1 or 2, and g is 0, 1 or 2 with a chlorosilane, a silanol, a silylamine, a silyl vinyl ether, a silazane and/or a cyclic siloxane.

13. The process as claimed in claim 12, wherein

Ar is a monovalent aromatic hydrocarbon radical having 6 to 14 carbon atoms per radical or is a monovalent aromatic hydrocarbon radical containing at least one oxygen and/or sulfur atom and having 5 to 15 ring atoms per radical, R is a linear or branched divalent hydrocarbon radical, having 1 to 40 carbon atoms per radical, which is optionally interrupted, by at least one oxygen atom, sulfur atom, and/or carboxyl group, E is a radical —O—$R^d$, F is a radical —$R^e$, $R^2$ is a radical

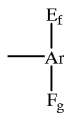

where

Ar, E and F are as defined above, $R^d$ is a monovalent hydrocarbon radical, having 1 to 18 carbon atoms per radical, which is optionally interrupted by at least one oxygen atom, $R^e$ is a monovalent hydrocarbon radical, having 1 to 18 carbon atoms per radical, which is optionally interrupted by at least one oxygen atom, f is 0, 1 or 2, and g is 0, 1 or 2.

14. The process as claimed in claim 12, wherein the chlorosilane is chlorotrimethylsilane, (chloromethyl) dimethylchlorosilane, (bromomethyl)dimethylchlorosilane, dimethylethylchlorosilane, triethylchlorosilane, dimethylpropylchlorosilane, tripropylchlorosilane, isopropyldimethylchlorosilane, triisopropylchlorosilane, 3-(chloropropyl)dimethylchlorosilane, dimethyl(3,3,3-trifluoropropyl)chlorosilane, tert-butyldimethylchlorosilane, tert-butyldiphenylchlorosilane, butyldimethylchlorosilane, tributylchlorosilane, triiso-butylchlorosilane, dimethyl(3,3,4,4,5,5,6,6,6-nonafluorohexyl)chlorosilane, hexyldimethylchlorosilane, dimethyl-octylchlorosilane, diisopropyloctylchlorosilane, decyl-dimethylchlorosilane, dimethyldodecylchlorosilane, dimethyl-octadecylchlorosilane, dimethylphenylchlorosilane, diphenyl-methylchlorosilane, triphenylchlorosilane, (pentafluorophenyl)dimethylchlorosilane, tribenzylchlorosilane, dimethyl(2-phenylethyl)chlorosilane, dimethylvinylchlorosilane or allyldimethylchlorosilane.

15. The process as claimed in claim 12, where the silazane is hexamethyl-disilazane, 1,3-bis(chloromethyl)-1,1,3,3-tetramethyl-disilazane, hexaethyldisilazane, 1,3-dipropyl1,1,3,3-tetra-methyldisilazane, 1,3-dioctyl-1,1,3,3-tetramethyldisilazane, 1,3-diphenyl-1,1,3,3-tetramethyldisilazane, 1,3-dimethyl-1,1,3,3-tetraphenyldisilazane, or 1,3-divinyl-1,1,3,3-tetramethyldisilazane.

16. The process as claimed in claim 12, wherein the silamine is N,N-dimethyltrimethylsilylamine, N,N-bis(trimethylsilyl)methyl-amine, N,N-diethyltrimethylsilylamine, N-benzyltrimethyl-silylamine, 1-(trimethylsilyl)imidazole, -(trimethyl-silyl)morpholine, 1-(trimethylsilyl)pyrrolidine, N-(tert-butyldimethylsilyl) dimethylamine, N-tert-butyltrimethyl-silylamine, 1-(tert-butyldimethylsilyl)imidazole, N-(hexyl-dimethylsilyl) dimethylamine, N-(octyldiisopropyl-silyl)-dimethylamine, N-(octadecyldiisobutylsilyl)dimethyl-amine, N-(octadecyldiisopropylsilyl)dimethylamine, or triphenyl-silylamine.

17. A method for polymerizing cationically polymerizable organic monomers which comprises cationically polymerizing said monomers in the presence of a photoinitiator according to claim 1.

18. The method according to claim 17, wherein the monomers are epoxides, vinyl ethers, organopolysiloxanes containing epoxy groups, polysiloxanes containing alkenyloxy groups, or olefins.

19. The method according to claim 18, wherein the alkenyloxy groups are vinyloxy groups or propenyloxy groups.

* * * * *